(12) United States Patent
Lim et al.

(10) Patent No.: US 8,232,823 B1
(45) Date of Patent: Jul. 31, 2012

(54) FREQUENCY CONTROL CLOCK TUNING CIRCUITRY

(75) Inventors: Teik Wah Lim, Bayan Lepas (MY); Eng Huat Lee, Ayer Itam (MY); Ie Chen Chia, Sitiawan (MY); Thow Pang Chong, Sungai Ara (MY); Boon Jin Ang, Butterworth (MY); Kim Pin Tan, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/479,515

(22) Filed: Jun. 5, 2009

(51) Int. Cl.
*H03L 7/06* (2006.01)
(52) U.S. Cl. .......................... 327/158; 327/276
(58) Field of Classification Search .................. 327/158, 327/161, 525, 276, 277
See application file for complete search history.

(56) References Cited

U.S. PATENT DOCUMENTS

| | | | |
|---|---|---|---|
| 5,204,559 A * | 4/1993 | Deyhimy et al. | 327/232 |
| 6,459,652 B1 * | 10/2002 | Lee et al. | 365/233.14 |
| 6,741,107 B2 * | 5/2004 | Borkar et al. | 327/153 |
| 6,861,886 B1 * | 3/2005 | Ludden et al. | 327/156 |
| 7,277,357 B1 * | 10/2007 | Ma et al. | 365/233.12 |
| 7,636,875 B2 * | 12/2009 | Corsi et al. | 714/701 |
| 2003/0048121 A1 * | 3/2003 | Jung | 327/172 |
| 2005/0184776 A1 * | 8/2005 | Pilo et al. | 327/158 |
| 2005/0231247 A1 * | 10/2005 | Cho | 327/158 |
| 2007/0171760 A1 * | 7/2007 | Gomm et al. | 365/233 |
| 2009/0096498 A1 * | 4/2009 | Huang | 327/158 |

* cited by examiner

*Primary Examiner* — Quan Tra
(74) *Attorney, Agent, or Firm* — Womble Carlyle Sandridge & Rice, LLP (57) ABSTRACT

Circuits and a method for tuning an integrated circuit (IC) are disclosed. The IC includes multiple programmable fuses coupled to a control block. The programmable fuses used may be one-time programmable (OTP) fuses. The control block reads settings or data stored in the programmable fuses. A tuning circuit coupled to the control block receives the delay transmitted by the control block. The tuning circuit allows tuning of the IC without changes to the fabrication mask. The tuning circuit may include delay chains to provide additional delay to the IC when needed and the delay in the tuning circuit is configured based on the delay value stored in the programmable fuses and transmitted by the control block.

20 Claims, 8 Drawing Sheets

FREQUENCY CONTROL CLOCK TUNING CIRCUITRY

BACKGROUND

A frequency control circuit, e.g., a phase-locked loop (PLL) circuit, is generally used to align and minimize the difference between data and clock paths in an integrated circuit (IC). PLL compensation aligns the clock so that the transition edges of the clock are at the middle of the data window for more accurate data capture. Normally, as long as the transition edges of the clock are positioned so that each rising or falling edge occurs in between a corresponding data window, the input data will be captured by the device. However, for devices that support high data transfer rates (e.g. 1 GHz or higher), the clock needs to be positioned so that each transition edge occurs approximately at the middle of each data window to ensure that each input is accurately captured. Applications with high data transfer rates may include input data that changes rapidly, causing the input data window to be substantially smaller than it would be for applications with lower data transfer rates. Therefore, if the clock is not tuned such that each transition edge is properly aligned with the data window, some of the input data might be missed because the rising edge of the clock may occur too late in the data window for the input data to be timely captured.

Usually, a predicted delay compensation value is determined prior to fabrication of a device. The actual, or at least more accurate, delay compensation value can only be determined on a fabricated device. In many cases, for example, in structured ASIC devices, a test chip would need to be fabricated to obtain the actual delay compensation value. This approach is cumbersome because a different test chip is needed for every structured ASIC device that does not share a similar base. In order to determine the actual delay compensation value for such a device, a specific fabrication mask needs to be used for a specific test chip. Such an approach is both time-consuming and cost-intensive.

Therefore, it is desirable to eliminate the need to create a test chip for every device to determine the actual delay compensation value. It is within this context that the invention arises.

SUMMARY

Embodiments of the present invention include circuits and a method for tuning an integrated circuit (IC).

It should be appreciated that the present invention can be implemented in numerous ways, such as a process an apparatus, a system, a device or a method on a computer readable medium. Several inventive embodiments of the present invention are described below.

In one embodiment, an IC with multiple programmable fuses is disclosed. A control block is coupled to the programmable fuses to read settings stored in the programmable fuses. The control block reads configuration information stored in the programmable fuses and transmits the settings to a tuning circuit. The tuning circuit is coupled to the control block to receive delay settings transmitted by the control block. The tuning circuit can be tuned or set with different delay values based on the delay settings from the programmable fuses transmitted by the control block. The tuning circuit is used to tune or shift a clock signal in the IC.

In an alternative embodiment, the IC has a frequency control circuit. In an exemplary embodiment, the frequency control circuit may be a phase-locked loop (PLL) circuit that receives a system clock signal. The frequency control circuit is coupled to a clock tree circuitry. An output of the clock tree circuitry is connected to an input of the frequency control circuit, forming a feedback path to the frequency control circuit. Both the frequency control circuit and the clock tree circuitry align the system clock with received data signals. A tuning circuit is placed in between the frequency control circuit and the clock tree circuitry. The tuning circuit can be used to apply a delay to the output of the frequency control circuit or the output of the clock tree circuitry. The delay applied by the tuning circuit can be used to better align the system clock with the data signals in the IC.

In yet another embodiment in accordance with the present invention, a method for tuning an IC is provided. The method includes determining the actual delay values for netlist paths in the IC. In one embodiment, the actual delay values are actual values for a fabricated IC. The actual delay values are then compared with a set of estimated delay values to determine a deviation between the actual delay values with the estimated ones. In one embodiment, the estimated delay values are obtained from a simulation of the IC while the actual delay values are obtained by testing and configuring a fabricated device. A tuning circuit in the IC is configured based on the deviation to adjust a clock path in the IC. In one embodiment, the tuning circuit offsets the deviation in the clock path.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe circuits and a method for tuning an integrated circuit (IC).

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create an IC with a configurable delay chain to align a low-voltage differential signaling (LVDS) clock rate with the device data rate. For devices that support fast LVDS channel with high data transfer rate, the clock transition edge should be located at the middle of the data window in order to ensure successful data capture. It should be appreciated that for very fast devices, the data window is generally very small as compared to slower devices. In order to ensure all the rapidly changing data is captured, the clock should be positioned so that every clock edge occurs at the middle of its corresponding data window. However, this condition is true only when the clock and data phases are aligned. In most cases, both the data and the clock paths have different delays, i.e., one path may be faster or slower than the other. The disclosed embodiments provide a more accurate tuning mechanism to better align data and clock paths in an IC device without requiring changes to the fabrication mask. One embodiment describes a tuning mechanism in a fabricated device that can compensate the usually small deviation between the predicted delay compensation value obtained from simulation results and the actual delay value obtained from the fabricated device. A control block and a non-volatile memory that stores the number of delay circuitry or delay cells for providing the needed delay is placed in the IC to configure a tuning circuit to offset any delay mismatch. Appropriate delay, if needed, can be provided by the tuning circuit or an additional delay chain in the IC.

Figure 1:
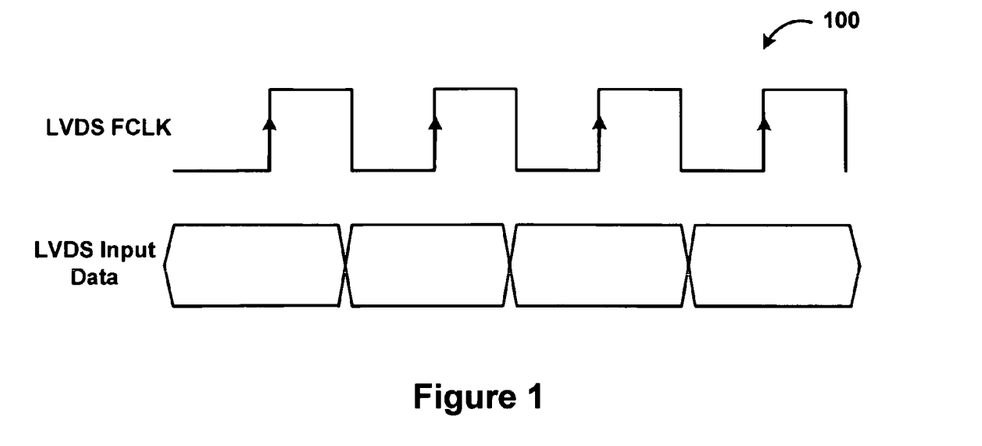
FIG. 1 is an exemplary waveform that shows a desirable relationship between an LVDS clock and an LVDS data rate.

FIG. 1 is an exemplary waveform 100 that shows the ideal relationship between an LVDS clock and the LVDS data rate. Generally, an edge-triggered device only captures the data it receives at every clock transition edge. FIG. 1 shows the rising transition edges of LVDS FCLK aligned at the middle of each LVDS Input Data window. This ensures that every input is captured because every rising clock edge is at the middle of the data window as there is ample time for the LVDS Input Data to be captured before the end of a clock cycle. It should be appreciated that data should be captured close to the middle of the data window because there may be timing jitter on the edges of each data window. Therefore, each rising or falling edge of the clock, in this instance LVDS FCLK, should be aligned as close as possible to the middle of each data window to ensure that clean or jitter-free data is captured at every data window. Even though FIG. 1 shows LVDS FCLK with each rising clock edge positioned in the middle of each LVDS Input Data window, one skilled in the art should appreciate that data can also be captured at every falling clock edge if desired, and the corresponding clock can be tuned so that each falling clock edge is positioned at the middle of the data input window.

Figure 2:
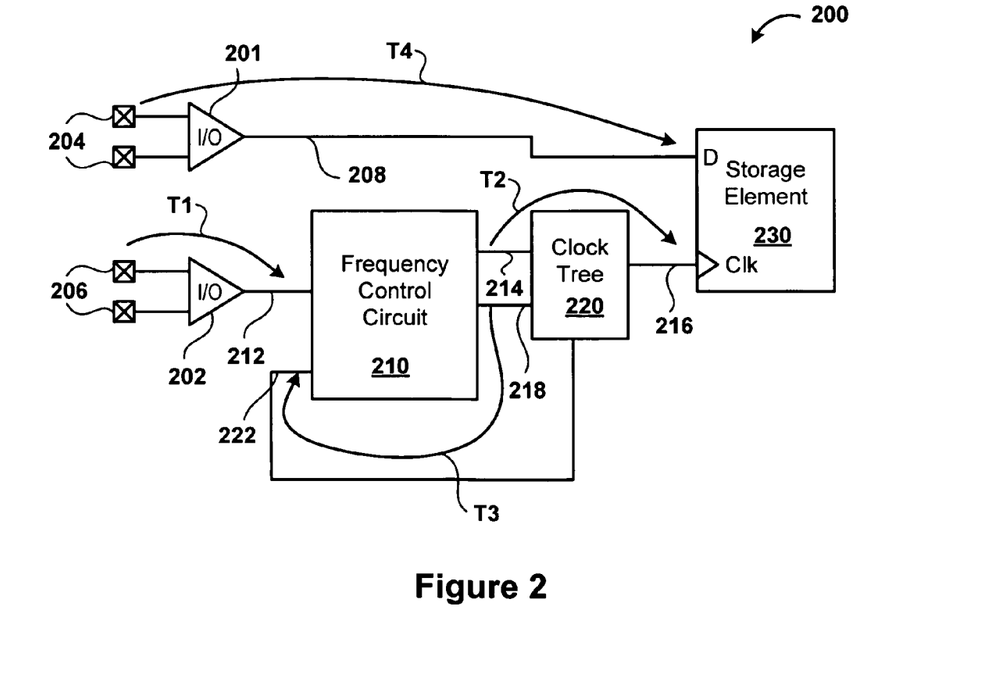
FIG. 2, meant to be illustrative and not limiting, shows a clock circuit an the associated data and clock paths.

FIG. 2, meant to be illustrative and not limiting, shows circuit 200 and corresponding data and clock paths. I/O buffer 201 carries input data from input pins 204 to storage element 230 through connection 208 while I/O buffer 202 carries a system clock signal from input pins 206 to clock terminal 216 of storage element 230. The clock signal from I/O buffer 202 is propagated through connection 212 to frequency control circuit 210 and clock tree circuitry 220 to clock input terminal 216 of storage element 230. In one embodiment, frequency control circuit 210 is a phase-locked loop (PLL) circuit and storage element 230 is a register. In another embodiment, frequency control circuit 210 is a delay-locked loop (DLL) circuit. One skilled in the art should appreciate that even though either a PLL or a DLL can be used as frequency control circuit 210, a DLL may not provide as much fine tuning as a PLL. If a DLL is used, the rate or speed of LVDS clock tree circuitry 220 should be the same as the system clock received at I/O buffer 202. On the contrary, if a PLL is used, the speed of the system clock received at I/O buffer 202 can be different from the speed of LVDS clock tree 220 as the clock signal can be multiplied or divided by PLL circuit 210. In other words, a PLL circuit may provide a more flexible tuning option compared to a DLL circuit even though both circuits can be used in this context.

The system clock signal, propagated through I/O buffer 202, frequency control circuit 210 and clock tree circuitry 220, takes a longer time to reach storage element 230 compared to input data from I/O buffer 201 which is directly coupled to storage element 230 through connection 208. Ideally, in order for both the input data from I/O buffer 201 and the system clock signal from I/O buffer 202 to reach register 230 at the same phase, the data and clock signals at I/O buffers 201 and 202, respectively, need to be in the same phase and share the same frequency. Both the data and clock paths also need to be tuned to fulfill the following equation: $T4=T1+T2+\delta T2-T3-\delta T3$.

In the above equation, T4 represents the data path delay from the input terminal of I/O buffer 201 to the input terminal of register 230 while T1 is the path delay from input terminals 206 of I/O buffer 202 to frequency control circuit 210. T2 refers to the path delay from output 214 of frequency control circuit 210 to clock input terminal 216 of storage element 230 and T3 is the clock feedback path delay from output terminal 218 of frequency control circuit 210 which feeds back to feedback clock input terminal 222 of frequency control circuit 210. For devices that utilize the same metal base layer, the values for T1, T2, T3 and T4 are constant across different devices while the appropriate $\delta T2$ and $\delta T3$ values can be set based on different design requirements. In one embodiment, $\delta T2$ and $\delta T3$ are the necessary adjustments for T2 and T3 delay values and can be determined from the equation: $\delta T2-\delta T3=T4-T1-T2+T3$. However, for devices that do not share the same metal base layer, the values for T1, T2, T3 and T4 may vary based on specific design specifications and there may be deviations between the estimated $\delta T2$ and $\delta T3$ values obtained during simulation and the actual $\delta T2$ and $\delta T3$ values on the fabricated device. The following embodiments provide techniques to set the actual delay values for T1, T2, T3, T4, $\delta T2$ and $\delta T3$ on devices that do not necessarily utilize the same metal base layer without any changes to the fabrication mask.

Figure 3A:
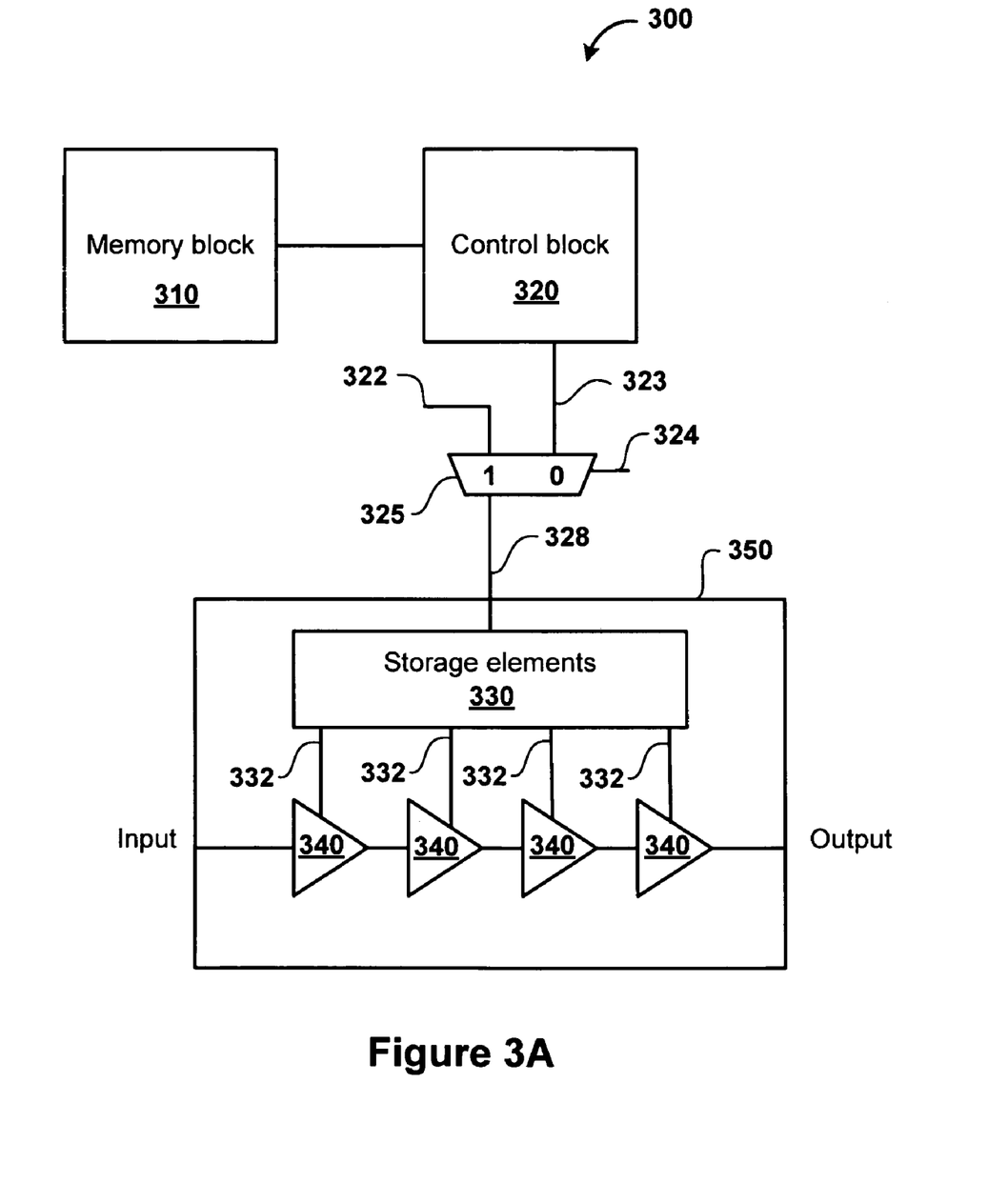
FIG. 3A, meant to be illustrative and not limiting, shows a memory block and a control block connected to a tuning circuit as an embodiment in accordance with the present invention.

FIG. 3A, meant to be illustrative and not limiting, shows memory block 310, control block 320 and tuning circuit 350 in circuit 300 as an embodiment in accordance with the present invention. Memory block 310 may contain a plurality or array of memory elements. Memory elements discussed herein can refer to one-time programmable fuses, switches or any other type of non-volatile storage elements capable of retaining the stored data even when not powered. Memory block 310 is coupled to control block 320 which reads the settings stored in memory block 310 and transmits the information, i.e., the required delay, to tuning circuit 350. In one embodiment, memory block 310 is configured with the appropriate delay during characterization of the device. One skilled in the art will appreciate that characterization refers to the overall testing of the device to measure performance and determine the behavior of the fabricated device. Therefore, in one embodiment, a multiplexer 325 is placed in between control block 320 and tuning circuit 350. Even though a multiplexer 325 is shown in FIG. 3A, one skilled in the art should appreciate that any logic element, e.g., a programmable switch, capable of selecting the desired input for a particular mode of operation between two or more inputs can be used in place of multiplexer 325.

Still referring to FIG. 3A, input terminal 322 is selected in characterization mode, while input terminal 323 is selected in user mode. In other words, when the device is being tested and tuned, delay cells 340 in tuning circuit 350 will be configured through input terminal 322 of multiplexer 325. In one embodiment, input 322 of multiplexer 325 is coupled to a Joint Test Action Group (JTAG) interface. The JTAG interface, omitted in order to not obscure the present invention, is used to configure the delay needed by setting and resetting delay cells 340. One skilled in the art will appreciate that the embodiments described herein may support JTAG boundary scan circuitry that complies with IEEE Std. 1149.1-2001 specification. Once the required delay is determined, memory block 310 is configured with the delay value. In an exemplary embodiment, one-time programmable fuses are used in memory block 310 to store the appropriate delay value. In this embodiment, the one-time programmable fuses are blown based on the delay determined during characterization of the device. Output 328 transmits either data from JTAG interface connected to input 322 or data from control block 320. In one embodiment, select line 324 defaults to '0' to connect control block 320 to tuning circuit 350 when in user mode. User mode in this context refers to the actual utilization of the device to implement a specific design.

Figure 3B:
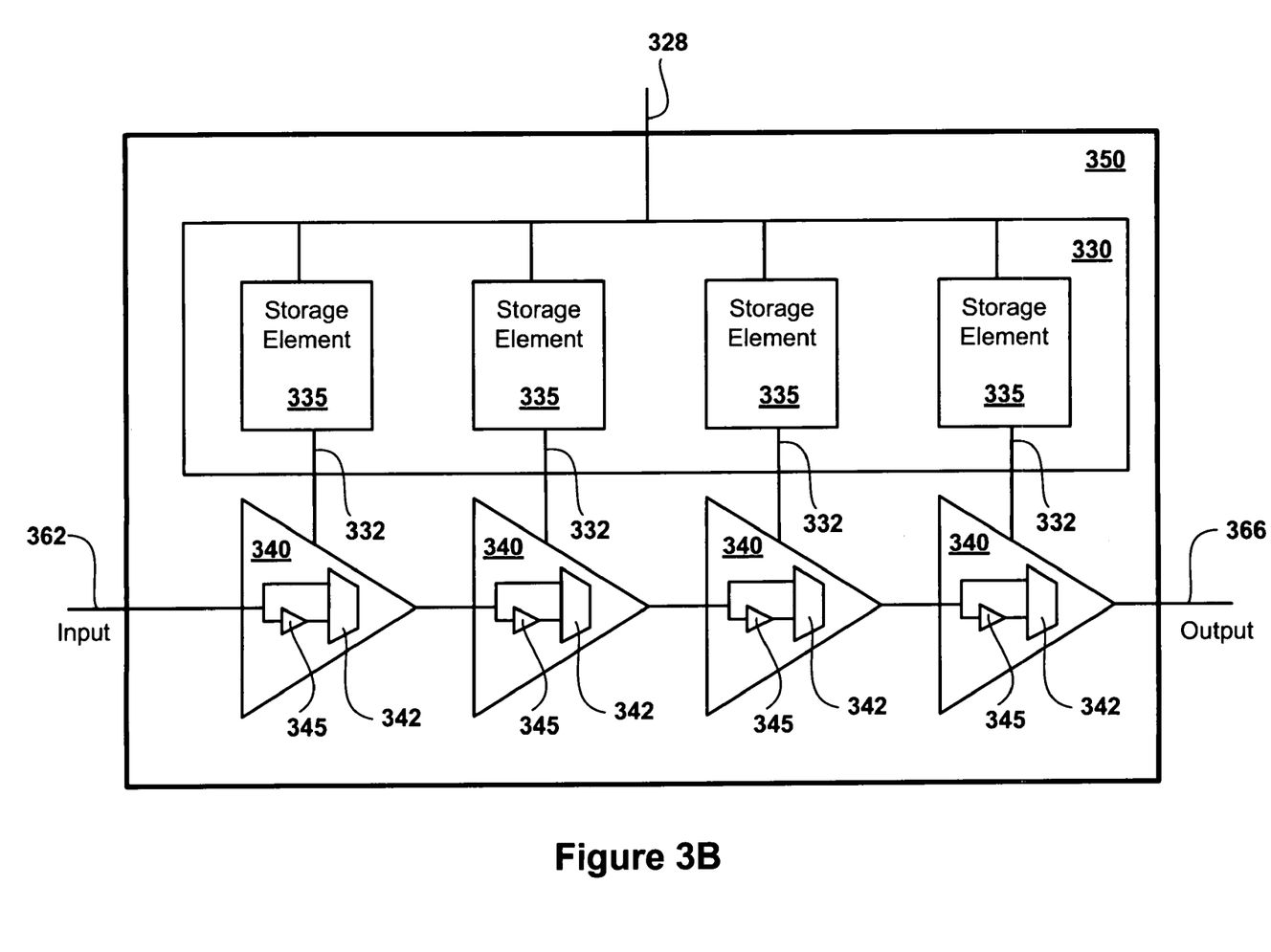
FIG. 3B, meant to be illustrative and not limiting, shows a detailed representation of a tuning circuit as an embodiment in accordance with the present invention.

When in user mode, control block 320 reads the settings stored in memory block 310, e.g., delay cells settings, and transmits the settings to tuning circuit 350. Tuning circuit 350 includes storage element module 330 which holds settings read from control block 320. Storage element module 330 is connected to a chain of delay cells 340 through output lines 332. Each of delay cells 340 is set according to the values stored in register block 330, details of which are shown in FIG. 3B and described in the following paragraph. Even though only a few delay cells 340 are shown in FIG. 3A, one skilled in the art should appreciate that more or fewer delay cells 340 can be used to create a longer or shorter delay chain if necessary.

FIG. 3B, meant to be illustrative and not limiting, shows a detailed representation of tuning circuit 350 as an embodiment in accordance with the present invention. Output 328 from multiplexer 325 of FIG. 3A is transmitted to storage element module 330. Storage element module 330 includes multiple storage elements 335 that hold and store data received from output line 328. Each of storage elements 335 is connected to a corresponding delay cell 340 through output terminals 332. In one embodiment, each delay cell 340 is made up of a multiplexer 342 and a delay buffer 345 coupled to an input of multiplexer 342. Output from storage elements 335 is coupled to select line 332 of multiplexer 342 in each corresponding delay cell 340. Accordingly, registers 335 configure delay cells 340 based on data from output 328 of multiplexer 325 of FIG. 3A. Input received at input terminal 362 passes through each delay cell 340 in tuning circuit 350. Input terminal 362 of tuning circuit 350 may be coupled to another circuit, e.g, a frequency control circuitry and output terminal 366 may be coupled to yet another circuit, e.g., another frequency control circuitry, or clock tree circuitry in an IC. Based on how each delay cell 340 is configured, signals from input terminal 362 may be delayed for a specific amount of time. For instance, two of delay cells 340 may be configured to delay signals received from input terminal 362, i.e., signals from input terminal 362 pass through delay buffer 345 of two delay cells 340. Any of delay cells 340 can therefore be configured so that multiplexer 342 selects either the input with or without the delay. Output terminal 366 of tuning circuit 350 then transmits the properly tuned signal received at input terminal 362 to a frequency control circuit, details of which are explained in the following paragraphs.

Figure 4:
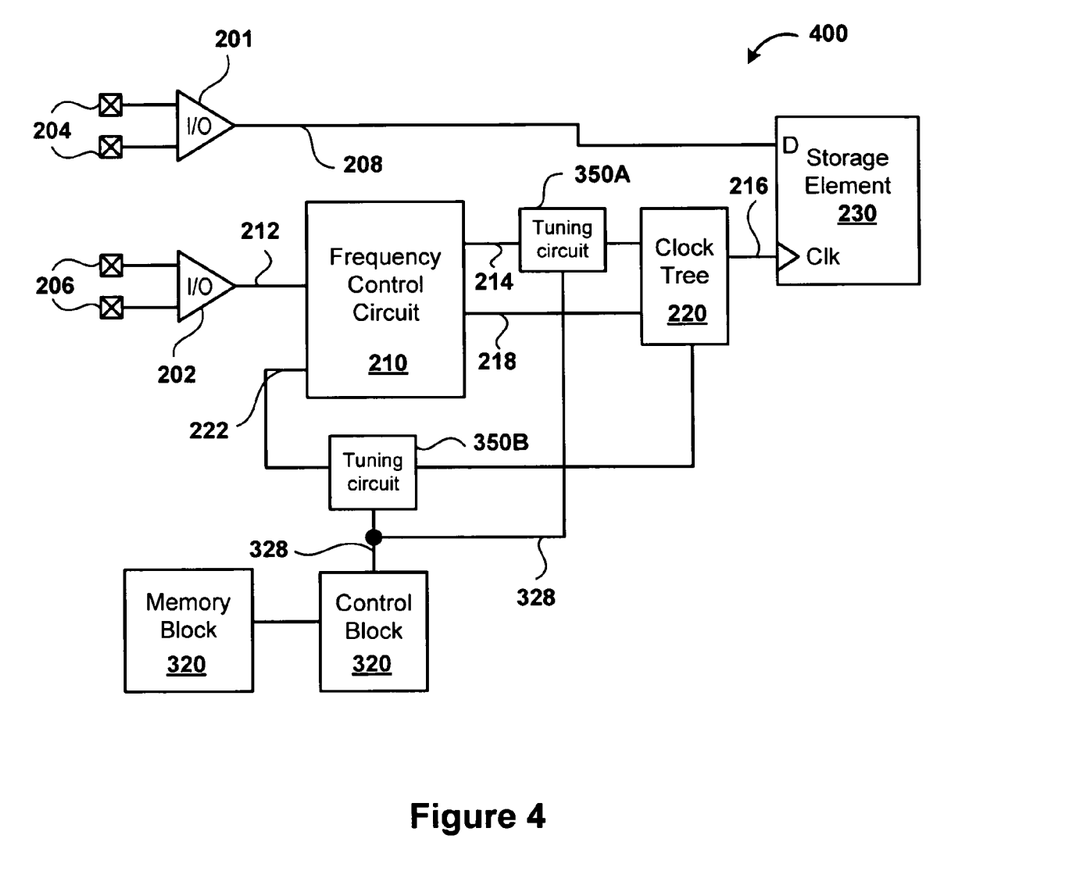
FIG. 4, meant to be illustrative and not limiting, shows a plurality of tuning circuits used in high speed clock circuitry as an embodiment of the present invention.

FIG. 4, meant to be illustrative and not limiting, shows tuning circuits 350A and 350B used in high speed clock circuitry 400 as an embodiment of the present invention. In one embodiment, circuit 400 may be an I/O circuit in a programmable logic device (PLD). For the sake of brevity, elements shown in FIG. 2 and described in earlier paragraphs, e.g, I/O buffers 201 and 202, connection 208, frequency control circuit 210, clock tree circuitry 220 and register 230, are not repeated or described in detail here. Tuning circuit 350A is placed in between output 214 of frequency control circuit 210 and the input terminal of LVDS clock tree circuitry 220. Another tuning circuit, tuning circuit 350B, is placed in the feedback path of frequency control circuit 210, in between the output terminal of LVDS clock tree circuitry 220 and feedback clock input terminal 222 of frequency control circuit 210.

Both tuning circuits 350A and 350B are connected to control block 320. Control block 320 reads information, i.e., the required delay needed, from memory block 310 to configure tuning circuits 350A and 350B in order to tune the clock signal with the data input so that every clock transition edge occurs approximately at the middle of each data window, as shown in the waveform of FIG. 1. It should be appreciated that an IC may have a positive or negative clock skew. An overcompensated clock has a positive clock skew while an undercompensated clock has a negative clock skew. In this case, if the delay value obtained from simulation is greater than the actual delay value measured on the fabricated device, the clock feedback path is undercompensated. If, on the other hand, the delay value obtained from simulation is less than the actual delay value measured, then the clock feedback path is overcompensated. In the embodiment of FIG. 4, if the feedback path is undercompensated, then tuning circuit 350B is used to apply an additional delay to the undercompensated feedback path. If the feedback path is overcompensated, tuning circuit 350A is used to apply an additional delay to output 214 of frequency control circuit 210. In one embodiment, tuning circuit 350A effectively shifts the system clock, from the perspective of FIG. 1, to the right while tuning circuit 350B shifts the system clock to the left, although the roles may be reversed. In another embodiment, when tuning circuit 350A is enabled, tuning circuit 350B is disabled and when tuning circuit 350A is disabled, tuning circuit 350B is enabled.

Each of tuning circuits 350A and 350B may have a number of delay cells similar to delay cells 340 of FIG. 3A and memory block 310 may include a number of programmable fuses. In one embodiment, the number of programmable fuses used in memory block 310 is determined by the total number of delay cells in tuning circuits 350A and 350B. For example, if each of tuning circuits 350A and 350B has 4 delay cells, there would be a total of 8 fuses controlling the delay cells in both circuits. Therefore, in one embodiment, each delay cell in tuning circuits 350A and 350B is controlled by a programmable fuse or a corresponding storage element in memory block 310. In another embodiment, decoders may be used in place of registers 335 of FIG. 3B. Therefore, if a pair of 2-to-4 decoders or a single 3-to-8 decoder is used in place of registers 335 of FIG. 3B, then, only 3 fuses are needed to control the 8 delay cells (based on the same example above).

Figure 5A:
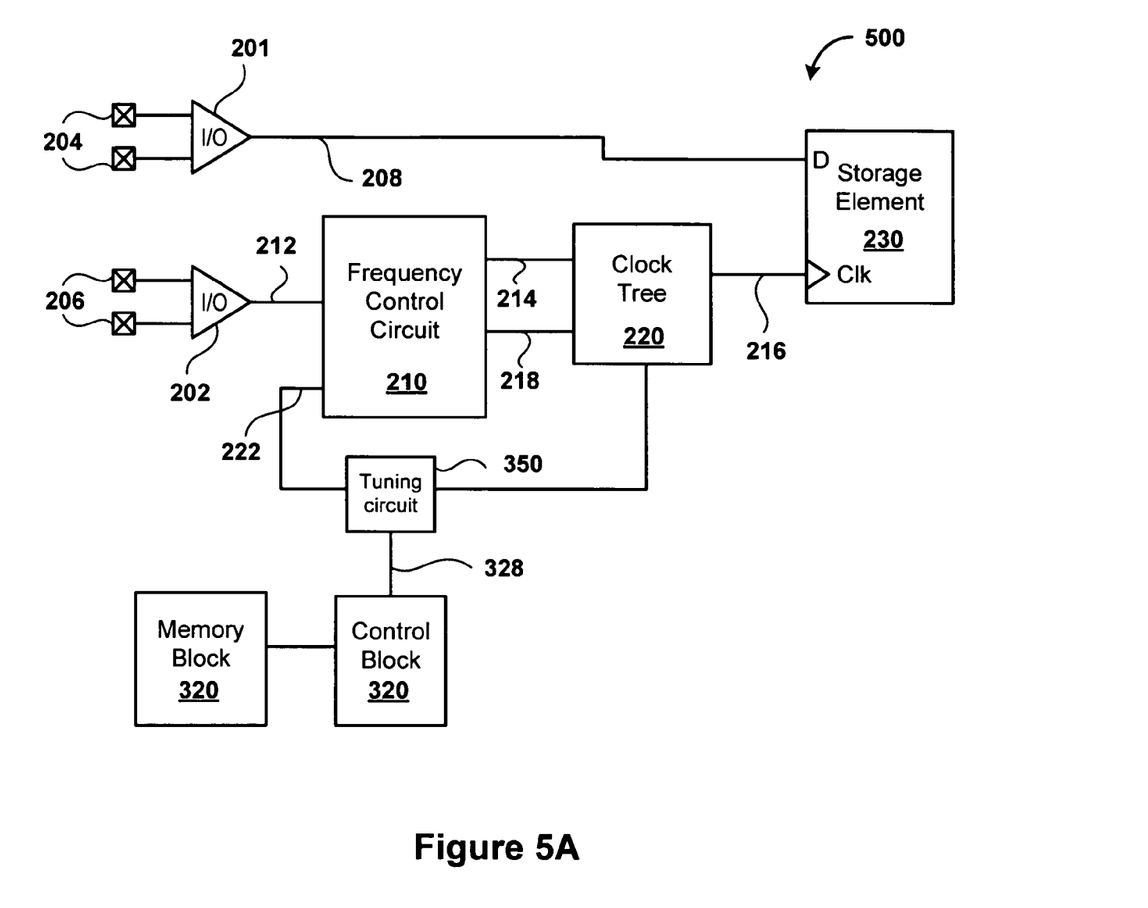
FIG. 5A, meant to be illustrative and not limiting, shows a circuit with a tuning circuit coupled to a feedback path as another embodiment in accordance with the present invention.

FIG. 5A, meant to be illustrative and not limiting, shows circuit 500 with tuning circuit 350 as another embodiment in accordance with the present invention. Circuit 500 is similar to circuit 400 with the exception that only one tuning circuit 350 is used in circuit 500. Tuning circuit 350 is placed in the feedback path of frequency control circuit 210, in between the output terminal of LVDS clock tree 220 and feedback clock terminal 222 of frequency control circuit 210. In the embodiment of FIG. 5A, the feedback path of frequency control circuit 210 is undercompensated during simulation. As a result of the undercompensation, a single tuning circuit 350, placed in the feedback path of frequency control circuit 210, is sufficient to adjust the undercompensated system clock by providing an additional delay to the feedback path of frequency control circuit 210.

Figure 5B:
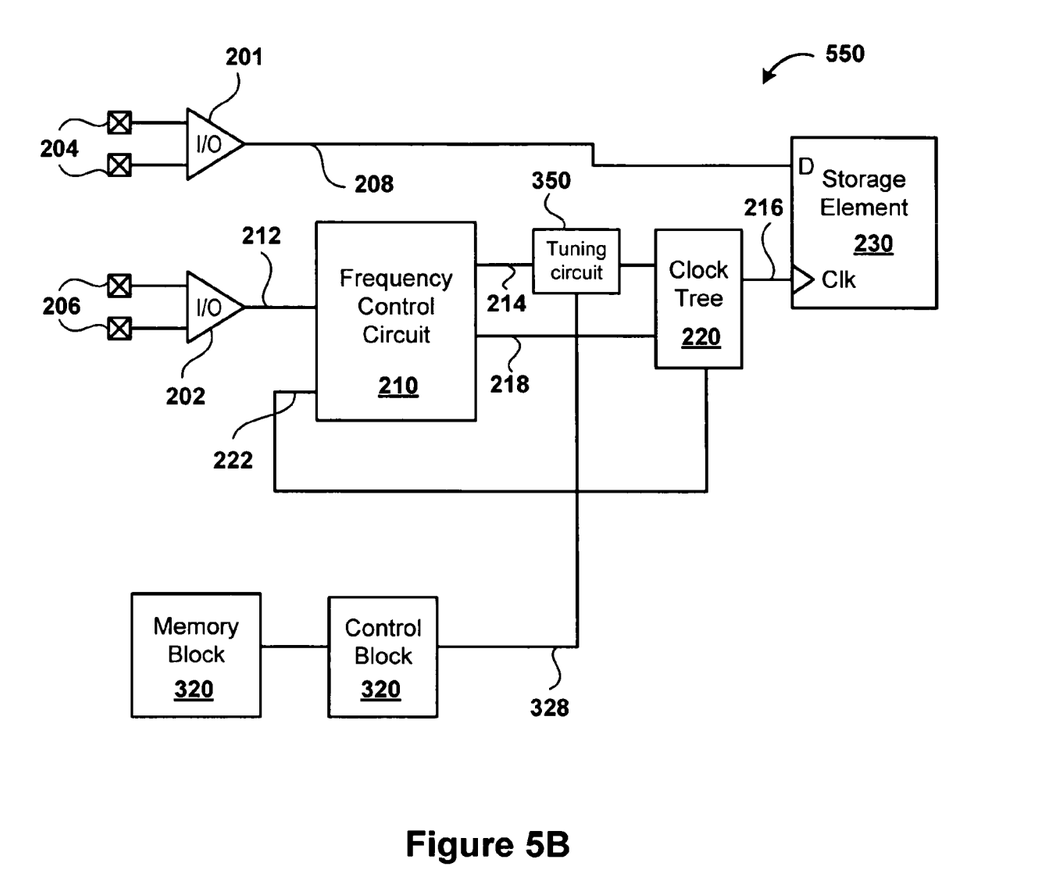
FIG. 5B, meant to be illustrative and not limiting, shows a circuit with a tuning circuit coupled to an output of a frequency control circuit as yet another embodiment in accordance with the present invention.

FIG. 5B, meant to be illustrative and not limiting, shows circuit 550 with tuning circuit 350 as yet another embodiment in accordance with the present invention. Circuit 550 is similar to circuit 500 except tuning circuit 350 is placed in between frequency control circuit 210 and LVDS clock tree 220. In one embodiment, the feedback path of frequency control circuit 210 is overcompensated during simulation. Since the feedback path is overcompensated, circuit 550 can be fine tuned using a single tuning circuit 350. Tuning circuit 350, placed in between output 214 of frequency control circuit 210 and clock tree circuitry 220, provides an additional delay to output 214 of frequency control circuit.

Figure 6:
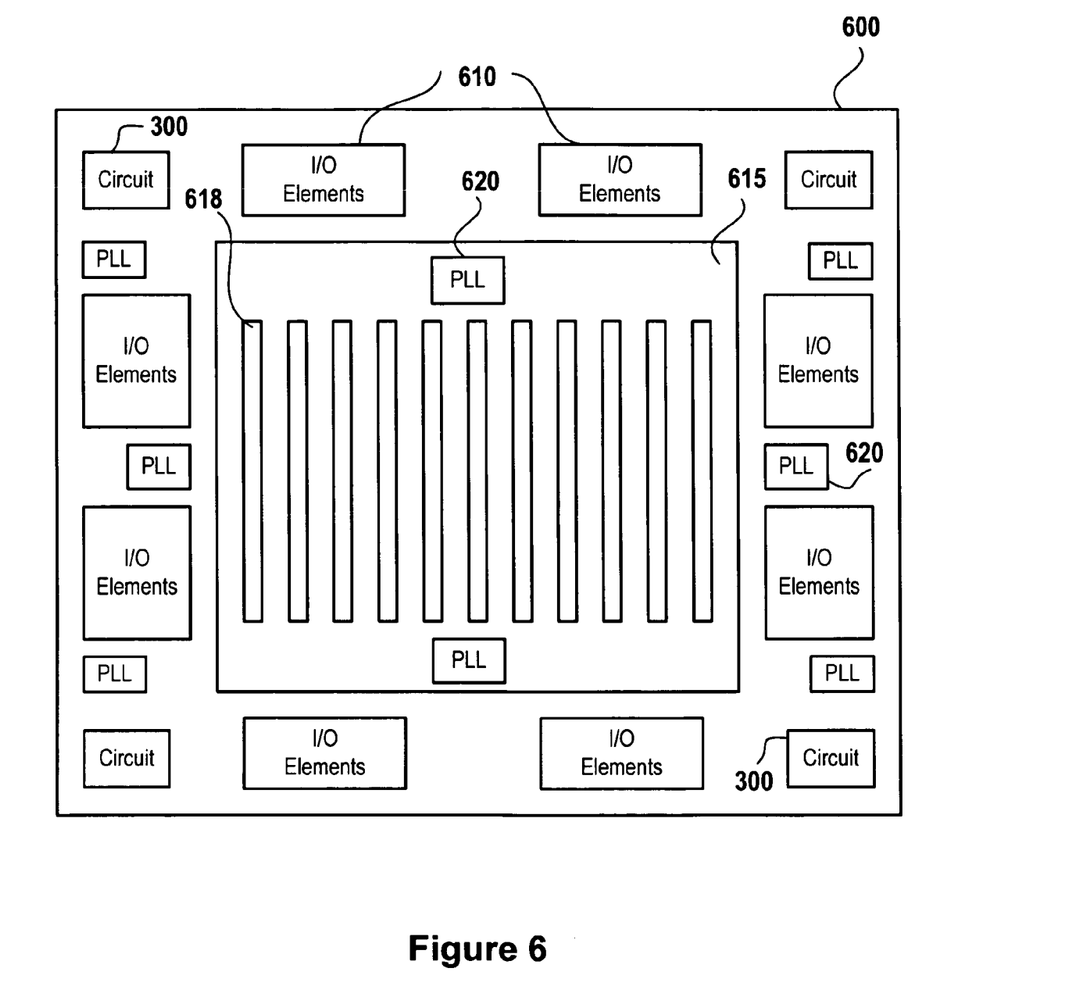
FIG. 6, meant to be illustrative and not limiting, shows a simplified block diagram of a programmable logic device (PLD) that can include aspects of the present invention.

FIG. 6, meant to be illustrative and not limiting, shows a simplified block diagram of PLD 600 that can include aspects of the present invention. Programmable device 600 includes logic region 615 and I/O elements 610. Logic region 615 may be populated with logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user. In the embodiment shown, region 615 also includes a plurality of embedded memory blocks 618. Some of the memory blocks 618 may be medium-embedded-memory (MEAB) blocks while others may be mega-RAM (MRAM) blocks. Other auxiliary circuits such as phase-locked loops (PLLs) 620 for clock generation and timing, can be located outside the core logic region 615, e.g., in between I/O elements 610, and inside the core logic region 615 as shown in FIG. 6. Circuit 300, which includes memory block 310, control block 320 and tuning circuit 350 of FIG. 3A, may be placed outside the core logic region 615.

Figure 7:
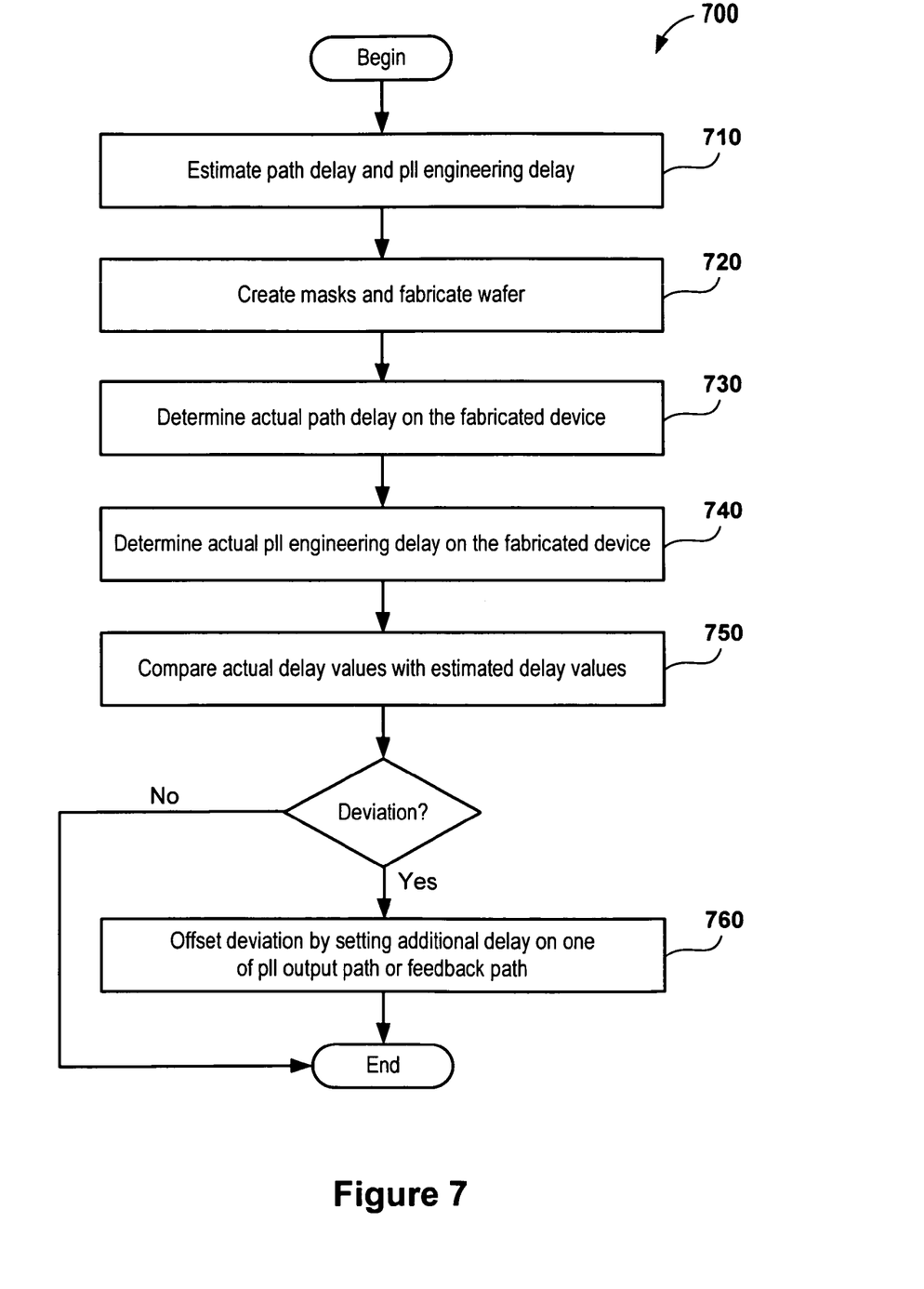
FIG. 7 is a simplified flow chart showing a method flow for tuning a fabricated device as another embodiment in accordance with the present invention.

FIG. 7 is a simplified flow chart showing method flow 700 for tuning a fabricated device as another embodiment in accordance with the present invention. Delays for different paths and PLL engineering delay in a netlist of a design are estimated in operation 710. In one embodiment, the design is simulated to obtain the estimated delays for various paths, i.e., data, clock and feedback paths. The PLL engineering delay can then be determined based on the simulation result. As an illustrative example, the data path, clock path and feedback path in the design correspond to T4, T1+T2 and T3, respectively, as shown in FIG. 2. Likewise, the PLL engineering delay refers to the values δT2 and δT3 in the equation: T4=T1+T2+δT2−T3−δT3, as mentioned and explained above. Masks are created and the wafer is fabricated in operation 720. Actual delays for the different paths, i.e., data, clock and feedback paths, on the fabricated device are determined in operation 730. Based on the actual delays of the different paths, the actual PLL engineering delay on the fabricated device is determined in operation 740. In one embodiment, the actual values are obtained during characterization of the fabricated device; an operation normally carried out to determine the performance and test the behavior of a fabricated device. In operation 750, the actual delay values are compared to the estimated delay values. If there are deviations between the actual delay values and the estimated delay values, additional delays are set either on an output path or the feedback path of the PLL in operation 760 to offset the deviation. In an exemplary embodiment, the additional delays are set using a tuning circuit similar to tuning circuit 350 as shown in FIG. 3A. With reference to FIG. 3A, the delay may be increased by setting delay cells 340 such that the input to tuning circuit 350 goes through additional delay cells 340 as needed. In the illustrated embodiment of FIG. 4, additional delays to offset the deviation are applied either by tuning circuit 350A, placed on the output path 214 of frequency control circuit 210, or tuning circuit 350B, placed in the feedback path of frequency control circuit 210.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:
1. An integrated circuit (IC) comprising:
a memory comprising a plurality of programmable fuses;
a control block coupled to the plurality of programmable fuses, wherein a value stored by the plurality of programmable fuses is operable to control operation of the control block, the value representing a delay between a clock signal and a data signal;
a first tuning circuit coupled to the control block, wherein the first tuning circuit is operable to receive a delay value from the control block, wherein the first tuning circuit is configured to shift a received clock signal according to the delay value to generate a shifted clock signal, the first tuning circuit comprising a plurality of logic cells arranged serially, wherein the received clock signal traverses one of a first signal path or a second signal path within each logic cell of the plurality of logic cells, each logic cell including a multiplexer operable to select one of the first signal path or the second signal path; and
a selection circuit coupled between the control block and the first tuning circuit, wherein the selection circuit is operable to select a test signal in a first mode of the IC and an output of the control block in a second mode of the IC, wherein utilization of the test signal in the first mode outputs the value for storage in the memory, and wherein the value read from the memory by the control block is selected in the second mode of the IC.

2. The IC of claim 1, further comprising:
a frequency control circuit coupled to the first tuning circuit, the frequency control circuit comprising delay cells configurable by preset delay values; and
a low-voltage differential signaling (LVDS) clock tree circuitry coupled to the frequency control circuit and the first tuning circuit, wherein the first tuning circuit is operable to shift an output of at least one of the frequency control circuit and the LVDS clock tree circuitry.

3. The IC of claim 2, further comprising:
a second tuning circuit coupled to the frequency control circuit and the LVDS clock tree circuitry, wherein the second tuning circuit is disabled if the first tuning circuit is enabled, and wherein the second tuning circuit is enabled if the first tuning circuit is disabled.

4. The IC of claim 3, wherein a first input terminal of the second tuning circuit is coupled to the control block, and wherein a second input terminal of the second tuning circuit is coupled to the LVDS clock tree circuitry, and wherein an output terminal of the second tuning circuit is coupled to the frequency control circuit.

5. The IC of claim 1, wherein the first tuning circuit comprises:
a plurality of storage elements coupled to the control block, wherein the plurality of storage elements is operable to store the delay value, and wherein a selection of one of the first signal path or the second signal path is based on the delay value received by each logic cell of the plurality of logic cells.

6. The IC of claim 5, wherein each logic cell of the plurality of logic cells comprises:
the multiplexer coupled to an output of a storage element of the plurality of storage elements; and
a buffer coupled to an input terminal of the multiplexer operable to buffer the clock signal received by the first tuning circuit.

7. The IC of claim 1, further comprising:
a storage element operable to receive the shifted clock signal and a data signal, wherein a phase of the shifted clock signal is equivalent to a phase of the data signal upon receipt by the storage element.

8. An integrated circuit (IC), comprising:
a frequency control circuit operable to receive a system clock at a first input terminal;
clock tree circuitry coupled to the frequency control circuit, wherein an output of the clock tree circuitry is coupled to a second input terminal of the frequency control circuit to form a feedback path, wherein the frequency control circuit and the clock tree circuitry are operable to align the system clock with a data signal in the IC; and
a first tuning circuit coupled to the frequency control circuit and the clock tree circuitry, wherein the first tuning circuit is operable to delay an output of at least one of the frequency control circuit and the clock tree circuitry to generate a shifted clock signal, wherein the first tuning circuit comprises a plurality of logic cells arranged serially, wherein the output of at least one of the frequency control circuit and the clock tree circuitry traverses one of a first signal path or a second signal path within each logic cell of the plurality of logic cells, each logic cell including a multiplexer operable to select one of the first signal path or the second signal path; and
a selection circuit coupled to the first tuning circuit, wherein the selection circuit is operable to select a test signal in a first mode of the IC and an output of a control block in a second mode of the IC, wherein utilization of the test signal in the first mode outputs a value for storage in a memory coupled to the control block, and wherein the value read from the memory by the control block is selected in the second mode of the IC.

9. The IC of claim 8, wherein the first signal path or the second signal path is selected based on configuration information received by the multiplexer.

10. The IC of claim 8, wherein
the memory comprises a plurality of fuses for storing the configuration information; and
the control block is coupled to the memory and an input of the selection circuit, wherein the control block is operable to use the configuration information stored in the fuse block to configure the first tuning circuit.

11. The IC of claim 10, wherein a fuse of the plurality of fuses is one-time programmable (OTP).

12. The IC of claim 8, wherein the first signal path within each logic cell of the plurality of logic cells comprises a delay cell, and wherein the first signal path is enabled or disabled responsive to the control block.

13. The IC of claim 8, further comprising:
a second tuning circuit coupled between the frequency control circuit and the clock tree circuitry.

14. The IC of claim 13, wherein the second tuning circuit is placed in the feedback path, wherein an input of the second tuning circuit is coupled to the output of the clock tree circuitry, and wherein an output of the second tuning circuit is coupled to a second input terminal of the frequency control circuit.

15. The IC of claim 8, wherein the frequency control circuit is a phase-locked loop (PLL) circuit.

16. The IC of claim 8, wherein the clock tree circuitry is low-voltage differential signaling (LVDS) clock tree circuitry.

17. An integrated circuit (IC) comprising:
a control block; and
a first tuning circuit coupled to the control block, wherein the first tuning circuit is operable to receive a delay value from the control block, wherein the first tuning circuit is configured to shift a received clock signal according to the delay value to generate a shifted clock signal, the first tuning circuit comprising a plurality of logic cells arranged serially, wherein the received clock signal traverses one of a first signal path or a second signal path within each logic cell of the plurality of logic cells, each logic cell including a multiplexer operable to select one of the first signal path or the second signal path; and
a selection circuit coupled to the first tuning circuit, wherein the selection circuit is operable to select a test signal in a first mode of the IC and an output of the control block in a second mode of the IC, wherein utilization of the test signal in the first mode outputs a value for storage in a memory coupled to the control block, and wherein the value read from the memory by the control block is selected in the second mode of the IC.

18. The integrated circuit of claim 17, wherein the memory comprises:
a plurality of programmable fuses and wherein
a frequency control circuit is coupled to the first tuning circuit, the frequency control circuit comprising delay cells configurable by preset delay values.

19. The integrated circuit of claim 17, further comprising:
a plurality of storage elements coupled to the control block, wherein the plurality of storage elements is operable to store the delay value, and wherein a selection of one of the first signal path or the second signal path for each logic cell of the plurality of logic cells is based on the delay value received by each logic cell of the plurality of logic cells.

20. The integrated circuit of claim 19, wherein each logic cell of the plurality of logic cells comprises:
the multiplexer coupled to an output of a storage element of the plurality of storage elements; and
a buffer coupled to a second input terminal of the multiplexer operable to buffer the clock signal received by the first tuning circuit.

* * * * *